(12) United States Patent
Chang et al.

(10) Patent No.: US 7,859,053 B2
(45) Date of Patent: Dec. 28, 2010

(54) INDEPENDENTLY ACCESSED DOUBLE-GATE AND TRI-GATE TRANSISTORS IN SAME PROCESS FLOW

(75) Inventors: Peter L. D. Chang, Portland, OR (US); Brian S. Doyle, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 214 days.

(21) Appl. No.: 11/335,103

(22) Filed: Jan. 18, 2006

(65) Prior Publication Data

US 2006/0128131 A1 Jun. 15, 2006

Related U.S. Application Data

(60) Division of application No. 11/124,572, filed on May 4, 2005, now Pat. No. 7,037,790, which is a continuation-in-part of application No. 10/955,670, filed on Sep. 29, 2004, now Pat. No. 7,422,946.

(51) Int. Cl.
*H01L 27/12* (2006.01)

(52) U.S. Cl. .............. 257/347; 438/283; 438/157; 438/164; 257/270; 257/331; 257/365; 257/287

(58) Field of Classification Search ............. 438/365, 438/366, 283, 157, 164; 257/207, 331, 365, 257/347
See application file for complete search history.

(56) References Cited

U.S. PATENT DOCUMENTS

| | | | |
|---|---|---|---|
| 4,487,652 A | 12/1984 | Almgren | |
| 4,818,715 A | 4/1989 | Chao | |
| 4,906,589 A | 3/1990 | Chao | |
| 4,907,048 A | 3/1990 | Huang | |
| 4,994,873 A | 2/1991 | Madan | |
| 4,996,574 A | 2/1991 | Shirasaki et al. | |
| 5,124,777 A | 6/1992 | Lee | |
| 5,338,959 A | 8/1994 | Kim et al. | |

(Continued)

FOREIGN PATENT DOCUMENTS

DE   10 203 998 A1   8/2003

(Continued)

OTHER PUBLICATIONS

International Search Report PCT/US2005/000947, mailed May 3, 2005 (7 pgs.).

(Continued)

*Primary Examiner*—N Drew Richards
*Assistant Examiner*—Jae Lee
(74) *Attorney, Agent, or Firm*—Blakely, Sokoloff, Taylor & Zafman LLP

(57) ABSTRACT

A method for fabricating double-gate and tri-gate transistors in the same process flow is described. In one embodiment, a sacrificial layer is formed over stacks that include semiconductor bodies and insulative members. The sacrificial layer is planarized prior to forming gate-defining members. After forming the gate-defining members, remaining insulative member portions are removed from above the semiconductor body of the tri-gate device but not the I-gate device. This facilitates the formation of metallization on three sides of the tri-gate device, and the formation of independent gates for the I-gate device.

9 Claims, 8 Drawing Sheets

U.S. PATENT DOCUMENTS

| | | |
|---|---|---|
| 5,346,839 A | 9/1994 | Sundaresan |
| 5,391,506 A | 2/1995 | Tada et al. |
| 5,466,621 A | 11/1995 | Hisamoto et al. |
| 5,521,859 A | 5/1996 | Ema et al. |
| 5,543,351 A | 8/1996 | Hirai et al. |
| 5,545,586 A | 8/1996 | Koh |
| 5,563,077 A | 10/1996 | Ha |
| 5,578,513 A | 11/1996 | Maegawa |
| 5,658,806 A | 8/1997 | Lin et al. |
| 5,701,016 A | 12/1997 | Burroughes et al. |
| 5,716,879 A | 2/1998 | Choi et al. |
| 5,739,544 A | 4/1998 | Koichiro et al. |
| 5,760,442 A | 6/1998 | Shigyo et al. |
| 5,804,848 A | 9/1998 | Mukai |
| 5,814,895 A | 9/1998 | Hirayama |
| 5,821,629 A | 10/1998 | Wen et al. |
| 5,827,769 A | 10/1998 | Aminzadeh et al. |
| 5,844,278 A | 12/1998 | Mizuno et al. |
| 5,880,015 A | 3/1999 | Hata |
| 5,888,309 A | 3/1999 | Yu |
| 5,889,304 A | 3/1999 | Watanabe et al. |
| 5,899,710 A | 5/1999 | Mukai |
| 5,905,285 A | 5/1999 | Gardner et al. |
| 5,908,313 A | 6/1999 | Chau et al. |
| 6,013,926 A | 1/2000 | Oku et al. |
| 6,018,176 A | 1/2000 | Lim |
| 6,051,452 A | 4/2000 | Shigyo et al. |
| 6,054,355 A | 4/2000 | Inumiya et al. |
| 6,066,869 A | 5/2000 | Noble et al. |
| 6,087,208 A | 7/2000 | Krivokapic et al. |
| 6,093,621 A | 7/2000 | Tseng |
| 6,117,741 A | 9/2000 | Chatterjee et al. |
| 6,153,485 A | 11/2000 | Pey et al. |
| 6,163,053 A | 12/2000 | Kawashima |
| 6,165,880 A | 12/2000 | Yaung et al. |
| 6,218,309 B1 | 4/2001 | Miller et al. |
| 6,251,763 B1 | 6/2001 | Inumiya et al. |
| 6,252,284 B1 | 6/2001 | Muller et al. |
| 6,261,921 B1 | 7/2001 | Yen et al. |
| 6,359,311 B1 | 3/2002 | Colinge et al. |
| 6,376,317 B1 | 4/2002 | Forbes et al. |
| 6,391,782 B1 | 5/2002 | Yu |
| 6,396,108 B1 | 5/2002 | Krivokapic et al. |
| 6,407,442 B2 | 6/2002 | Inoue et al. |
| 6,413,802 B1 | 7/2002 | Hu et al. |
| 6,413,877 B1 | 7/2002 | Annapragada |
| 6,437,550 B2 | 8/2002 | Andoh et al. |
| 6,459,123 B1 | 10/2002 | Enders et al. |
| 6,472,258 B1 | 10/2002 | Adkisson et al. |
| 6,475,869 B1 | 11/2002 | Yu |
| 6,475,890 B1 | 11/2002 | Yu |
| 6,483,156 B1 * | 11/2002 | Adkisson et al. ............ 257/401 |
| 6,525,403 B2 * | 2/2003 | Inaba et al. ................. 257/618 |
| 6,534,807 B2 | 3/2003 | Mandelman et al. |
| 6,537,885 B1 | 3/2003 | Kang et al. |
| 6,541,829 B2 | 4/2003 | Nishinohara et al. |
| 6,562,665 B1 | 5/2003 | Yu |
| 6,583,469 B1 | 6/2003 | Fried et al. |
| 6,605,498 B1 | 8/2003 | Murthy et al. |
| 6,610,576 B2 | 8/2003 | Nowak |
| 6,611,029 B1 | 8/2003 | Ahmed et al. |
| 6,630,388 B2 | 10/2003 | Sekigawa et al. |
| 6,635,909 B2 | 10/2003 | Clark et al. |
| 6,642,090 B1 | 11/2003 | Fried et al. |
| 6,645,797 B1 | 11/2003 | Buynoski et al. |
| 6,645,826 B2 | 11/2003 | Yamazaki et al. |
| 6,656,853 B2 | 12/2003 | Ito |
| 6,657,259 B2 | 12/2003 | Fried et al. |
| 6,680,240 B1 | 1/2004 | Maszara |
| 6,689,650 B2 | 2/2004 | Gambino et al. |
| 6,693,324 B2 | 2/2004 | Maegawa et al. |
| 6,696,366 B1 | 2/2004 | Morey et al. |
| 6,706,571 B1 | 3/2004 | Yu et al. |
| 6,709,982 B1 | 3/2004 | Buynoski et al. |
| 6,713,396 B2 | 3/2004 | Anthony |
| 6,716,684 B1 | 4/2004 | Krivokapic et al. |
| 6,716,690 B1 | 4/2004 | Wang et al. |
| 6,730,964 B2 | 5/2004 | Horiuchi |
| 6,744,103 B2 | 6/2004 | Snyder |
| 6,756,657 B1 | 6/2004 | Zhang et al. |
| 6,764,884 B1 | 7/2004 | Yu et al. |
| 6,770,516 B2 | 8/2004 | Wu et al. |
| 6,774,390 B2 | 8/2004 | Sugiyama et al. |
| 6,787,402 B1 | 9/2004 | Yu |
| 6,787,439 B2 | 9/2004 | Ahmed et al. |
| 6,787,845 B2 | 9/2004 | Deleonibus |
| 6,787,854 B1 | 9/2004 | Yang et al. |
| 6,790,733 B1 | 9/2004 | Natzle et al. |
| 6,794,313 B1 | 9/2004 | Chang |
| 6,794,718 B2 | 9/2004 | Nowak et al. |
| 6,798,000 B2 | 9/2004 | Luyken et al. |
| 6,800,885 B1 | 10/2004 | An et al. |
| 6,800,910 B2 | 10/2004 | Lin-Ming et al. |
| 6,803,631 B2 | 10/2004 | Dakshina-Murthy et al. |
| 6,812,075 B2 | 11/2004 | Fried et al. |
| 6,812,111 B2 | 11/2004 | Cheong et al. |
| 6,815,277 B2 | 11/2004 | Fried et al. |
| 6,821,834 B2 | 11/2004 | Ando |
| 6,833,588 B2 | 12/2004 | Yu et al. |
| 6,835,614 B2 | 12/2004 | Hanafi et al. |
| 6,835,618 B1 | 12/2004 | Dakshina-Murthy et al. |
| 6,838,322 B2 | 1/2005 | Pham et al. |
| 6,844,238 B2 | 1/2005 | Yeo et al. |
| 6,849,884 B2 | 2/2005 | Clark et al. |
| 6,852,559 B2 | 2/2005 | Kwak et al. |
| 6,855,606 B2 | 2/2005 | Chen et al. |
| 6,855,990 B2 | 2/2005 | Yeo et al. |
| 6,858,478 B2 | 2/2005 | Chau et al. |
| 6,864,519 B2 * | 3/2005 | Yeo et al. ..................... 257/206 |
| 6,867,433 B2 | 3/2005 | Yeo et al. |
| 6,867,460 B1 | 3/2005 | Anderson et al. |
| 6,869,868 B2 | 3/2005 | Chiu et al. |
| 6,884,154 B2 | 4/2005 | Mizushima et al. |
| 6,885,055 B2 | 4/2005 | Lee |
| 6,897,527 B2 | 5/2005 | Dakshina-Murthy et al. |
| 6,921,691 B1 | 7/2005 | Li et al. |
| 6,921,963 B2 | 7/2005 | Krivokapic et al. |
| 6,921,982 B2 | 7/2005 | Joshi et al. |
| 6,946,377 B2 * | 9/2005 | Chambers ................... 438/588 |
| 6,960,517 B2 | 11/2005 | Rios et al. |
| 6,967,351 B2 | 11/2005 | Fried et al. |
| 6,974,738 B2 | 12/2005 | Hareland |
| 7,018,551 B2 | 3/2006 | Beintner et al. |
| 7,045,401 B2 | 5/2006 | Lee et al. |
| 7,045,441 B2 * | 5/2006 | Chang et al. ................ 438/458 |
| 7,060,539 B2 | 6/2006 | Chidambarrao et al. |
| 7,061,055 B2 | 6/2006 | Sekigawa et al. |
| 7,071,064 B2 | 7/2006 | Doyle et al. |
| 7,074,623 B2 | 7/2006 | Lochtefeld et al. |
| 7,112,478 B2 | 9/2006 | Grupp et al. |
| 7,122,463 B2 | 10/2006 | Ohuchi |
| 7,141,856 B2 | 11/2006 | Lee et al. |
| 7,154,118 B2 | 12/2006 | Lindert |
| 7,163,851 B2 | 1/2007 | Adadeer et al. |
| 7,183,137 B2 | 2/2007 | Lee et al. |
| 7,187,043 B2 | 3/2007 | Arai et al. |
| 7,196,372 B1 * | 3/2007 | Yu et al. ..................... 257/316 |
| 7,238,564 B2 | 7/2007 | Ko et al. |
| 7,241,653 B2 | 7/2007 | Hareland et al. |
| 7,250,645 B1 | 7/2007 | Wang et al. |
| 2001/0019886 A1 | 9/2001 | Bruce et al. |
| 2002/0011612 A1 | 1/2002 | Hieda |
| 2002/0036290 A1 | 3/2002 | Inaba et al. |
| 2002/0081794 A1 | 6/2002 | Ito |

| | | | | | | |
|---|---|---|---|---|---|---|
| 2002/0166838 | A1 | 11/2002 | Nagarajan | JP | 9-162301 A | 6/1997 |
| 2002/0167007 | A1 | 11/2002 | Yamazaki et al. | JP | 2000037842 A | 1/2003 |
| 2003/0057486 | A1 | 3/2003 | Gambino | JP | 2003-298051 | 10/2003 |
| 2003/0067017 | A1 | 4/2003 | Ieong et al. | TW | 516232 | 1/2003 |
| 2003/0085194 | A1 | 5/2003 | Hopkins, Jr. | TW | 548799 | 8/2003 |
| 2003/0098488 | A1 | 5/2003 | O'Keeffe et al. | TW | 561530 | 11/2003 |
| 2003/0102497 | A1 | 6/2003 | Fried et al. | TW | 200402872 A | 4/2004 |
| 2003/0111686 | A1 | 6/2003 | Nowak | TW | 200405408 A | 4/2004 |
| 2003/0122186 | A1 | 7/2003 | Sekigawa et al. | WO | WO 02/43151 A | 5/2002 |
| 2003/0143791 | A1 | 7/2003 | Cheong et al. | WO | WO 2004/059726 A1 | 7/2004 |
| 2003/0151077 | A1 | 8/2003 | Mathew et al. | | | |
| 2003/0201458 | A1 | 10/2003 | Clark et al. | | | |
| 2003/0227036 | A1 | 12/2003 | Sugiyama et al. | | | |
| 2004/0031979 | A1 | 2/2004 | Lochtefeld et al. | | | |
| 2004/0036118 | A1 | 2/2004 | Abadeer et al. | | | |
| 2004/0036126 | A1 | 2/2004 | Chau et al. | | | |
| 2004/0036127 | A1 | 2/2004 | Chau et al. | | | |
| 2004/0038533 | A1* | 2/2004 | Liang ............ 438/689 | | | |
| 2004/0092062 | A1 | 5/2004 | Ahmed et al. | | | |
| 2004/0092067 | A1 | 5/2004 | Hanafi et al. | | | |
| 2004/0094807 | A1 | 5/2004 | Chau et al. | | | |
| 2004/0011910 | A1 | 6/2004 | Nowak et al. | | | |
| 2004/0110097 | A1 | 6/2004 | Ahmed et al. | | | |
| 2004/0126975 | A1 | 7/2004 | Ahmed et al. | | | |
| 2004/0132236 | A1 | 7/2004 | Doris et al. | | | |
| 2004/0166642 | A1 | 8/2004 | Chen et al. | | | |
| 2004/0180491 | A1 | 9/2004 | Arai et al. | | | |
| 2004/0191980 | A1 | 9/2004 | Rios et al. | | | |
| 2004/0195624 | A1 | 10/2004 | Liu et al. | | | |
| 2004/0198003 | A1 | 10/2004 | Yeo et al. | | | |
| 2004/0219780 | A1 | 11/2004 | Ohuchi | | | |
| 2004/0227187 | A1 | 11/2004 | Cheng et al. | | | |
| 2004/0238887 | A1 | 12/2004 | Nihey | | | |
| 2004/0238915 | A1* | 12/2004 | Chen et al. ............ 257/506 | | | |
| 2004/0256647 | A1 | 12/2004 | Lee et al. | | | |
| 2004/0262683 | A1 | 12/2004 | Bohr et al. | | | |
| 2004/0262699 | A1 | 12/2004 | Rios et al. | | | |
| 2005/0035415 | A1 | 2/2005 | Yeo et al. | | | |
| 2005/0093067 | A1 | 5/2005 | Yeo et al. | | | |
| 2005/0093075 | A1 | 5/2005 | Bentum et al. | | | |
| 2005/0093154 | A1 | 5/2005 | Kottantharayil et al. | | | |
| 2005/0104055 | A1 | 5/2005 | Kwak et al. | | | |
| 2005/0118790 | A1 | 6/2005 | Lee et al. | | | |
| 2005/0127362 | A1 | 6/2005 | Zhang et al. | | | |
| 2005/0139860 | A1 | 6/2005 | Snyder et al. | | | |
| 2005/0145941 | A1 | 7/2005 | Bedell et al. | | | |
| 2005/0156171 | A1 | 7/2005 | Brask et al. | | | |
| 2005/0156202 | A1 | 7/2005 | Rhee et al. | | | |
| 2005/0156227 | A1 | 7/2005 | Jeng | | | |
| 2005/0167766 | A1 | 8/2005 | Yagishita | | | |
| 2005/0184316 | A1 | 8/2005 | Kim et al. | | | |
| 2005/0215022 | A1 | 9/2005 | Adam et al. | | | |
| 2005/0224797 | A1 | 10/2005 | Ko et al. | | | |
| 2005/0224800 | A1 | 10/2005 | Lindert | | | |
| 2005/0227498 | A1 | 10/2005 | Furukawa et al. | | | |
| 2005/0230763 | A1 | 10/2005 | Huang et al. | | | |
| 2005/0272192 | A1 | 12/2005 | Oh et al. | | | |
| 2006/0014338 | A1 | 1/2006 | Doris et al. | | | |
| 2006/0063469 | A1* | 3/2006 | Talieh et al. ............ 451/5 | | | |
| 2006/0154478 | A1 | 7/2006 | Hsu et al. | | | |
| 2007/0093010 | A1 | 4/2007 | Mathew et al. | | | |
| 2007/0108514 | A1 | 5/2007 | Inoue et al. | | | |

FOREIGN PATENT DOCUMENTS

| | | |
|---|---|---|
| EP | 0 623 963 A1 | 11/1994 |
| EP | 1 202 335 A2 | 5/2002 |
| EP | 1 566 844 A2 | 8/2005 |
| GB | 2 156 149 | 10/1985 |
| JP | 59 145538 A | 8/1984 |
| JP | 02-303048 A | 12/1990 |
| JP | 6-224440 A | 6/1994 |
| JP | 06177089 | 6/1994 |

OTHER PUBLICATIONS

B. Jin, et al., "Mobility Enhancement in Compressively Strained SiGe Surface Channel PMOS Transistors with Hf02/TiN Gate Stack", Proceedings of the First Joint International Symposium, 206th Meeting of Electrochemical Society, Oct. 2004, pp. 111-122.

R. Chau, "Advanced Metal Gate/High-K Dielectric Stacks for High-Performance CMOS Transistors", Proceedings of AVS 5th International Conference of Microelectronics and Interfaces, Mar. 2004, (3 pgs.).

International Search Report PCT/US2005/033439, mailed Jan. 31, 2006 (7 pgs.).

International Search Report PCT/US2005/035380, mailed Feb. 13, 2006 (14 pgs.).

International Search Report PCT/US2005/037169, mailed Feb. 23, 2006 (11 pgs.).

Sung Min Kim, et al., A Novel Multi-channel Field Effect Transistr (McFET) on Bulk Si for High Performance Sub-80nm Application, IEDM 04-639, 2004 IEEE, pp. 27.4.1-27.4.4.

Yang-Kyu Choi, et al., "A Spacer Patterning Technology for Nanoscale CMOS" IEEE Transactions on Electron Devices, vol. 49, No. 3, Mar. 2002, pp. 436-441.

W. Xiong, et al., "Corner Effect in Multiple-Gate SOI MOSFETs" 2003 IEEE, pp. 111-113.

Weize Xiong, et al., "Improvement of FinFET Electrical Characteristics by Hydrogen Annealing" IEEE Electron Device Letters, vol. 25, No. 8, Aug. 2004, XP-001198998, pp. 541-543.

Fu-Liang Yang, et al., "5nm-Gate Nanowire. FinFET" 2004 Symposium on VLSI Technology Digest of Technical Papers, 2004 IEEE, pp. 196-197.

V. Subramanian et al., "A Bulk-Si-Compatible Ultrathin-body SOI Technology for Sub-100m MOSFETS" Proceeding of the 57th Annual Device Research Conference, pp. 28-29 (1999).

Hisamoto et al., "A Folded-channel MOSFET for Deepsub-tenth Micron Era", 1998 IEEE International Electron Device Meeting Technical Digest, pp. 1032-1034 (1998).

Huang et al., "Sub 50-nm FinFET: PMOS", 1999 IEEE International Electron Device Meeting Technical Digest, pp. 67-70 (1999).

Auth et al., "Vertical, Fully-Depleted, Surroundings Gate MOSFETS on sub-0.1um Thick Silicon Pillars", 1996 54th Annual Device Research Conference Digest, pp. 108-109 (1996).

Hisamoto et al., "A Fully Depleted Lean-Channel Transistor (DELTA)-A Novel Vertical Ultrathin SOI MOSFET", IEEE Electron Device Letters, V. 11(1), pp. 36-38 (1990).

Jong-Tae Park et al., "Pi-Gate SOI MOSFET" IEEE Electron Device Letters, vol. 22, No. 8, Aug. 2001, pp. 405-406.

Hisamoto, Digh et al. "FinFET—A Self-Aligned Double-Gate MOSFET Scalable to 20 nm", IEEE Transactions on Electron Devices, vol. 47, No. 12, Dec. 2000, pp. 2320-2325.

T. Park et al., "Fabrication of Body-Tied FinFETs (Omega MOSFETS) Using Bulk Si Wafers", 2003 Symposia on VLSI Technology Digest of Technical Papers, Jun. 2003, pp. 135-136.

A. Burenkov et al., "Corner Effect in Double and Tripe Gate FinFets", IEEE 2003, pp. 135-138.

S.T. Chang et al., "3-D Simulation of Strained Si/SiGe Heterojunction FinFETs", pp. 176-177.

International Search Report PCT/US2005/010505.

International Search Report PCT/US2005/020339.

International Search Report PCT/US 03/26242.

International Search Report PCT/US 03/39727.

International Search Report PCT/US 03/40320.

International Search Report PCT/US2004/032442.

International Search Report and Written Opinion PCT/US2006/000378.

International Search Report PCT/US2006/024516.

International Search Report PCT/US2006/037643.

T. Ludwig et al., "FinFET Technology for Future Microprocessors" 2003 IEEE, pp. 33-34.

Peter A. Stolk et al. "Modeling Statistical Dopant Fluctuations in MOS Transistors", 1998 IEEE, IEEE Transactions on Electron Devices, vol. 45, No. 9, Sep. 19987, pp. 1960-1971.

Evert Seevinck et al., "Static-Noise Margin Analysis of MOS SRAM Cells" 1987 IEEE, IEEE Journals of Solid-State Circuits, vol. SC-22, No. 5, Oct. 1987.

Yang-Kyu Choi et al. "Sub-20nm CMOS FinFET Technologies", IEEE 2001, IEDM 01-421 to 01-424.

M. Ieong et al. "Three Dimensional CMOS Devices and Integrated Circuits", IEEE 2003, CICC, San Jose, CA, Sep. 21-24, 2003, pp. 207-214.

E.J. Nowak et al., "Scaling Beyond the 65nm Node with FinFET-DGCMOS", IEEE 2003, CICC, San Jose, CA, Sep. 21-24, 2003, pp. 339-342.

E.C. Jones, "Doping Challenges in Exploratory Devices for High Performance Logic", 14$^{th}$ International Conference, Piscataway, NJ, Sep. 22-27, 2002, pp. 1-6.

T. Park et al. "PMOS Body-Tied FinFET (Omega MOSFET) Characteristics", Device Research Conference, Piscataway, NJ, Jun. 23-25, 2003, IEEE, pp. 33-34.

E.J. Nowak et al., "A Functional FinFET-DGCMOS SRAM Cell", International Electron Devices Meeting 2002, San Francisco, CA, Dec. 8-11, 2002, pp. 411-414.

Jae-Hyoun Park, "Quantum-wired MOSFET Photodetector Fabricated by Conventional Photolithography on SOI Substrate", Nanotechnology, 2004, 4$^{th}$ IEEE Conference on Munich, Germany, Aug. 16-19, 2004, Piscataway, NJ, pp. 425-427, XP010767302.

L. Chang et al. "CMOS Circuit Performance Enhancement by Surface Orientation Optimization" IEEE Transactions on Electron Devices, IEEE Service Center, Piscataway, NJ vol. 51, No. 10, Oct. 2004, pp. 1621-1627 XP001211140.

Stadele et al., "A Comprehensive Study of Corner Effects in Tri-gate Transistors", IEEE 2004, pp. 165-168.

Ali Javey et al., "Ballistic Carbon Nanotube Field-Effect Transistors", Nature, vol. 424, Aug. 7, 2003, pp. 654-657.

Chau, Robert et al., Advanced Depleted-Substrate Transistors: Single-gate, Double-gate and Tri-gate (Invited Paper), Components Research, Logic Technology Development, Intel Corporation, Hillsboro, OR, 2 pages.

Jing Guo, et al. "Performance Projections for Ballistic Carbon Nanotube Field-Effect Transistors", Applied Physics Letters, vol. 80, No. 17, pp. 3192-3194 (Apr. 29, 2004).

Ali Javey, et al., "High-K Dielectrics for Advanced Carbon-Nanotube Transistors and Logic Gates", Advance Online Publication, Published online, pp. 1-6 (Nov. 17, 2002).

Richard Martel, et al., "Carbon Nanotube Field Effect Transistors for Logic Applications" IBM, T.J. Watson Research Center, 2001 IEEE, IEDM 01, pp. 159-162.

David M. Fried, et al., "High-Performance P-Type Independent-Gate FinFETs, IEEE Electron Device Letters", vol. 25, No. 4, Apr. 2004, pp. 199-201.

David M. Fried, et al., "Improved Independent Gate N-Type FinFET Fabrication and Characterization", IEEE Electron Device Letters, vol. 24, No. 9, Sep. 2003, pp. 592-594.

Charles Kuo, et al. "A Capacitorless Double Gate DRAM Technology for Sub-100-nm Embedded and Stand-Alone Memory Applications", IEEE Transactions on Electron Devices, vol. 50, No. 12, Dec. 2003, pp. 2408-2416.

Charles Kuo, et al., "A Capacitorless Double-Gate DRAM Cell Design for High Density Applications", 2002 IEEE International Electron Devices Meeting Technical Digest, Dec. 2002, pp. 843-846.

Takashi Ohsawa, et al., "Memory Design Using a One-Transistor Gain Cell on SOI", IEEE Journal of Solid-State Circuits, vol. 37, No. 11, Nov. 2002, pp. 1510-1522.

T. Tanaka, et al., "Scalability Study on a Capacitorless 1T-DRAM: From Single-Gate PD-SOI to Double-Gate FinDRAM", 2004 IEEE International Electron Devices Meeting Technical Digest, Dec. 2004, 4 pages.

T. M. Mayer, et al., "Chemical Vapor Deposition of Fluoroalkylsilane Monolayer Films for Adhesion Control in Microelectromechanical Systems" 2000 American Vacuum Society B 18(5), Sep./Oct. 2000, pp. 2433-2440.

* cited by examiner

INDEPENDENTLY ACCESSED DOUBLE-GATE AND TRI-GATE TRANSISTORS IN SAME PROCESS FLOW

RELATED APPLICATIONS

This is a Divisional of application Ser. No. 11/124,572 filed May 4, 2005 now U.S. Pat. No. 7,037,790, which is a Continuation-in Part of application Ser. No. 10/955,670 filed Sep. 29, 2004 now U.S. Pat. No. 7,422,946.

FIELD OF THE INVENTION

The invention relates to the field of semiconductor processing.

BACKGROUND OF THE INVENTION

Independently-controlled double-gate (I-gate) transistors are a relatively recent development in semiconductor processing. They have two gates disposed on opposite sides of a channel, each gate capable of being independently controlled. This provides added transistor flexibility and enables, for example, using a single body to form a dynamic random-access memory (DRAM) cell. Tri-gate transistors are another relatively recent development in semiconductor processing. With tri-gate transistors, the gate forms adjacent three sides of a channel region. Tri-gate transistors, particularly when used with a high-k insulator and metal gate, can substantially improve the speed and performance of integrated circuits.

A number of I-gate structures have been proposed. This and other related technology is described at C. Kuo, *IEDM*, December 2002, following M. Chan Electron Device Letters, January 1994; C. Kuo, *IEDM*, December 2002, "A Hypothetical Construction of the Double Gate Floating Body Cell;" T. Ohsawa, et al., *IEEE Journal of Solid-State Circuits*, Vol. 37, No. 11, November 2002; David M. Fried, et al., "High-Performance P-Type Independent-Gate FinFETs," *IEEE Electron Device Letters*. Vol. 25, No. 4, April 2004; and David M. Fried, et al., "Improved Independent Gate N-Type FinFET Fabrication and Characterization," *IEEE Electron Device Letters*, Vol. 24, No. 9, September 2003. Tri-gate structures are described at, for instance, publication number U.S. 2004-0036127-A1.

DETAILED DESCRIPTION

In the following description, the fabricating of an independently accessed, double-gate (I-gate) transistor and a tri-gate transistor on a common substrate is described. Numerous specific details are set forth, such as specific materials, in order to provide a thorough understanding of the present invention. It will be apparent to one skilled in the art, that the present invention may be practiced without these specific details. In other instances, well known processing steps have not been described in detail, in order not to unnecessarily obscure the present invention. For example, well-known cleaning steps, and some protective layers often used in the fabrication of integrated circuits, are not described.

The method which follows describes the formation of both the I-gate transistor and a tri-gate transistor in a single process flow. While the fabrication of only a single I-gate transistor and a single tri-gate transistor are illustrated, it will be apparent to one skilled in the art, that in a typical integrated circuit, numerous such transistors are simultaneously fabricated. Moreover, the I-gate and tri-gate transistors may be fabricated wherever needed in the integrated circuit. Thus, a single circuit, such as a buffer, may have both I-gate and tri-gate transistors. In some cases, for example in a DRAM, an array of memory cells using only I-gate transistors may be fabricated and connected to peripheral circuits which use both I-gate and tri-gate transistors. A memory using I-gate memory cells is described in "Memory with Split-Gate Devices and Method of Fabrication," Ser. No. 10/816,282, filed Mar. 31, 2004, and assigned to the assignee of the present application.

Figure 1A:
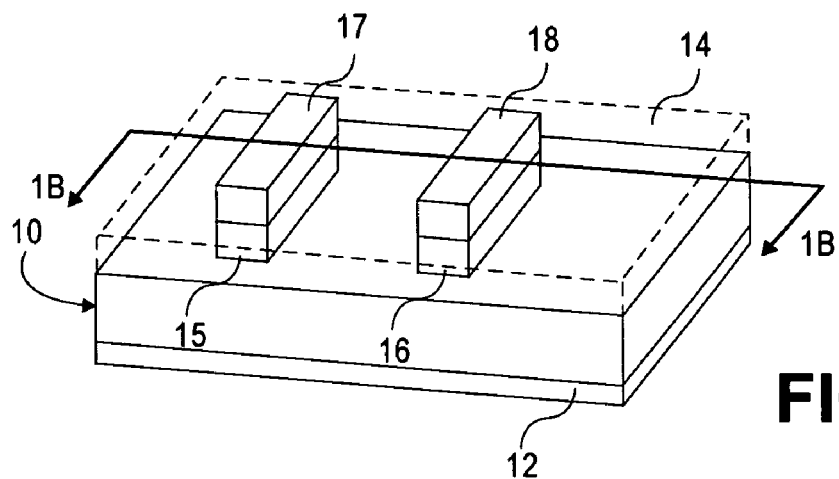
FIG. 1A is a perspective view of a substrate which includes two silicon bodies with overlying insulative members
Figure 1B:
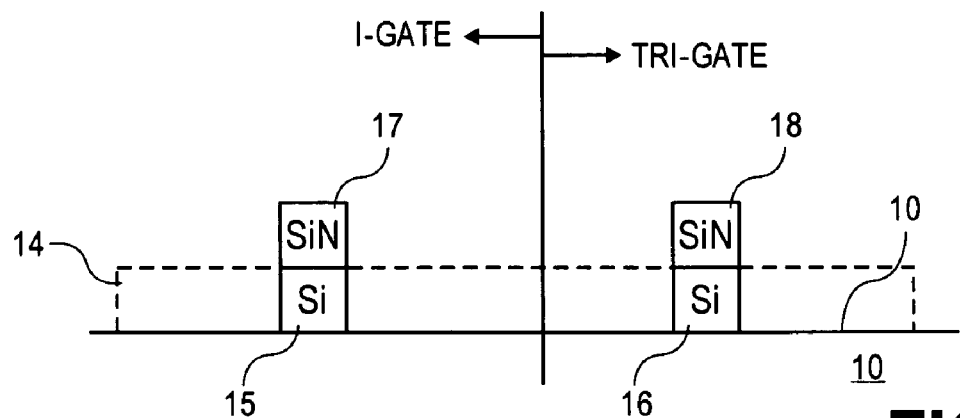
FIG. 1B is a cross-sectional view of the structure of FIG. 1 taken through section line 1B-1B of FIG. 1A.

In one embodiment, the transistors are fabricated on an oxide layer 10 which is formed on a semiconductor substrate, for example a silicon substrate 12. The transistor bodies are fabricated from a monocrystalline silicon layer 14 (shown in dotted lines in FIGS. 1A and 1B) disposed on layer 10. This silicon-on-insulator (SOI) substrate is well-known in the semiconductor industry, where as shown, the layer 14 is disposed on the layer 10. By way of example, the SOI substrate is fabricated by bonding the oxide layer 10 and a silicon layer 14 onto the substrate 12, and then, planarizing the layer 14 so that it is relatively thin. This relatively thin, low body effect layer, is used to form the bodies of active devices, as mentioned. Other techniques are known for forming an SOI substrate including, for instance, the implantation of oxygen into a silicon substrate to form a buried oxide layer. In the subsequent cross-sectional views, the transistors are shown fabricated on the oxide layer 10, the underlying silicon substrate 12 is not shown.

The layer 14 may be selectively ion-implanted with an n-type dopant in the regions where n channel devices are to be fabricated, and with a p type dopant in those regions where p channel devices are to be fabricated. This is used to provide the relatively light doping typically found in the channel regions of MOS devices fabricated in a CMOS integrated circuit. Both the I-gate and tri-gate transistors may be fabricated with the described process as either p channel or n channel devices. (The doping of the channel regions of the transistors may be done at other points in the process flow such as the point in the process shown in FIG. 1A or 7A.)

In the processing for one embodiment, a protective oxide (not shown) is disposed on the silicon layer 14 followed by the deposition of a silicon nitride layer. The nitride layer is masked to define a plurality of insulative members, such as members 17 and 18 of FIGS. 1A and 1B. Then, the underlying silicon layer 14 is etched in alignment with these members resulting in the silicon bodies 15 and 16.

The width of the silicon bodies 15 and 16 may be the critical dimension in a particular process, for instance, in a 30 nanometer (nm) gate length process, these bodies may have a width of 30 nm. The thickness of the layer 14, and the silicon nitride layer from which the members 17 and 18 are formed, may each be, by way of example, in the range of 10-100 nm.

Figure 2A:
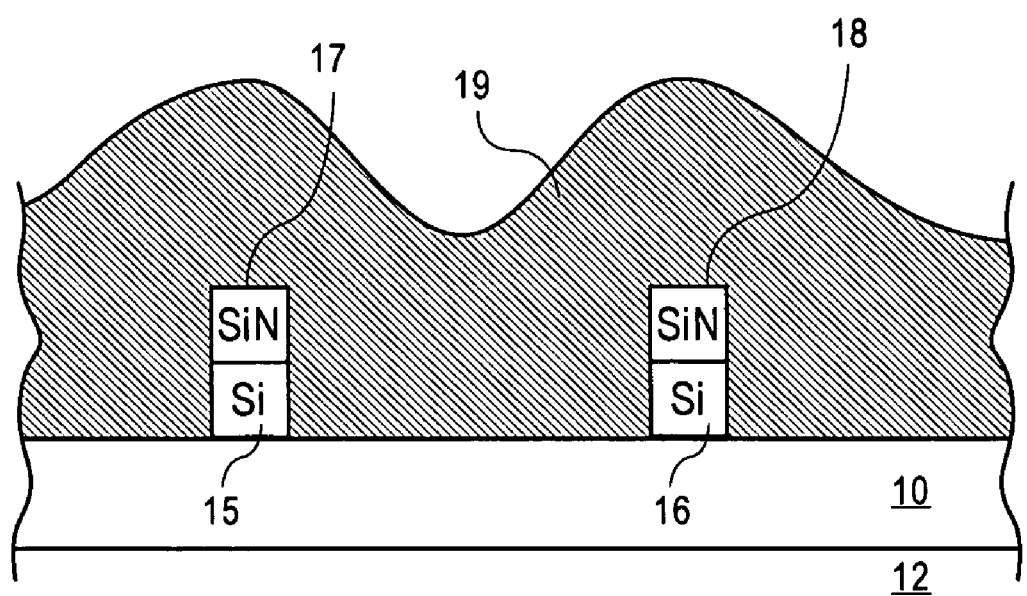
FIG. 2A illustrates the structure of FIG. 1 following deposition of a sacrificial layer.

Next as shown in FIG. 2A, a sacrificial layer 19 is deposited over the stacks (i.e. the insulative members/silicon bodies 17/15 and 18/16) and on the oxide layer 10. In one embodiment, this layer is a polysilicon layer 50-200 nm thick. However, other materials may be used for the sacrificial layer 19. The material used for the sacrificial layer 19 should be able to protect the channel regions of the devices from ion implantation during the formation of the source and drain regions, as will be described. And, the sacrificial layer should be selectively removable-so as not to significantly impact the integrity of an ILD formed around the sacrificial layer after patterning to form sacrificial gate members, as will be described. Additionally, the insulative members, such as for example member 18 should be able to be selectively removed in the presence of the sacrificial layer, so as to facilitate formation of the tri-gate transistor.

In accordance with one embodiment, unlike conventional methods, the sacrificial layer 19 is planarized prior to patterning and etching the sacrificial gate-defining members. To the extent that the sacrificial layer 19 is not planar, gate patterning issues, such as those discussed with respect to FIG. 10, can be encountered.

Figure 10:
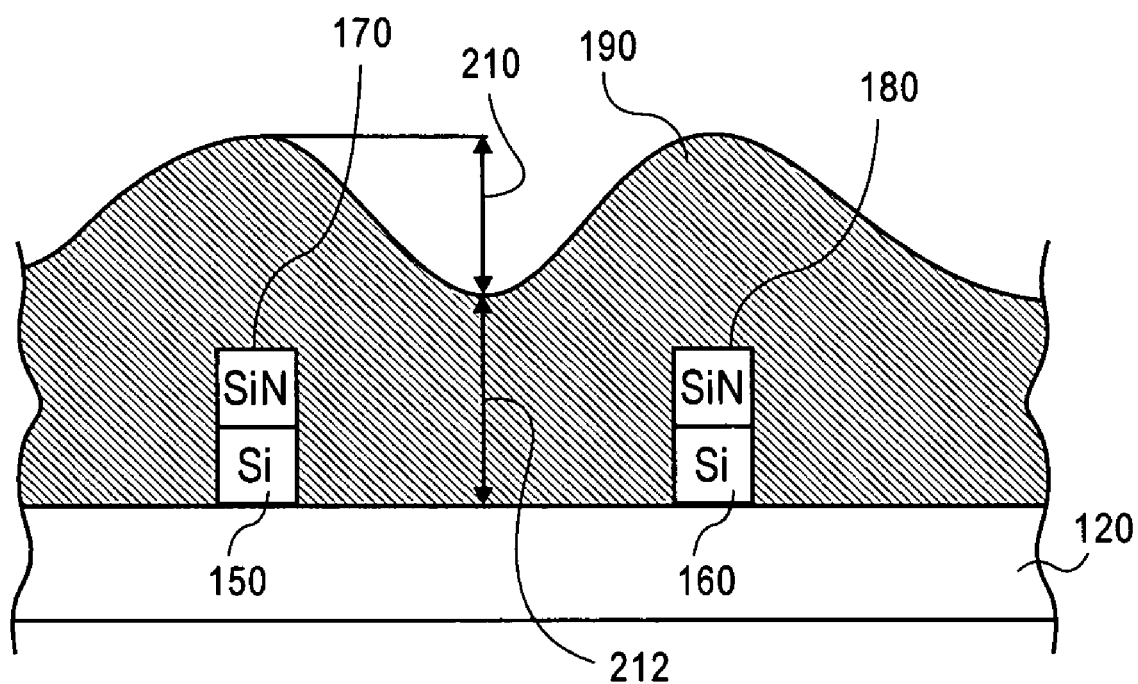
FIG. 10 is a cross-sectional view showing topography variations that can be encountered when forming gate-defining members using conventional processing.

As shown in FIG. 10, after the silicon nitride (SiN) layer and underlying silicon layer are patterned and etched to the form stacks that include insulative members/silicon bodies 170/150 and 180/160 (similar to stacks 17/15 and 18/16 in FIGS. 1A and 1B), a sacrificial layer 190, such as a sacrificial polysilicon layer, is deposited over the stacks. The sacrificial layer 190 is deposited so that it completely covers the stacks. The sacrificial layer 190 is subsequently patterned and etched to form sacrificial gate-defining members. The gate-defining members temporarily occupy regions where gates for the I-gate and tri-gate transistors are eventually formed. The gate-defining members can also be used to facilitate selective removal the insulative member 180 during formation of the tri-gate transistor.

However, as shown in FIG. 10, forming the sacrificial layer so that it completely covers the stacks can result in the formation of large topography non-uniformities 210. These non-uniformities can create difficulties when patterning resist features that define the sacrificial gate-defining members. In addition, as one of ordinary skill can appreciate, because the degree of the non-uniformity 210 depends on the distance between underlying features and the thickness of the sacrificial layer (i.e., underlying features that are in closer to each other can have less topography associated with them than features that are spaced farther apart), variations can exist in the thickness 212 of the sacrificial layer. These thickness variations can affect the quality of the etch process used to define the gate-defining members and result in underetch in some regions and overetch in other regions. To the extent that the topography impacts photolithography and/or causes underetch or overetch of the sacrificial polysilicon layer, it can result in the manifestation of defects in the permanent gate structures. These defects can thereby impact the yield, functionality, and reliability of resulting transistors.

Figure 2B:
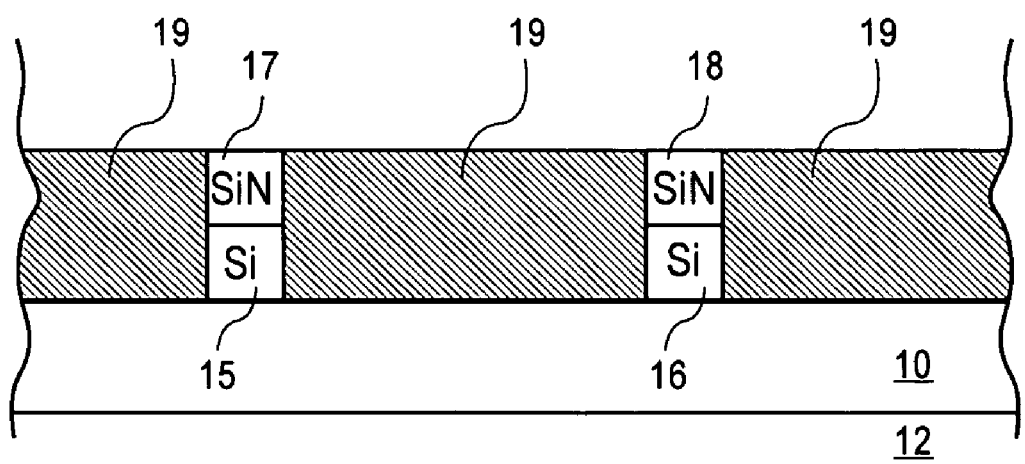
FIG. 2B illustrates the structure of FIG. 2A following planarization of the sacrificial layer.

One embodiment of the present invention overcomes these limitations by first planarizing the sacrificial polysilicon layer, and thereby eliminating the topography and its associated variations, prior to patterning, etching, and forming the sacrificial gate-defining members. More specifically after depositing the sacrificial layer 19, as shown in FIG. 2A. The sacrificial layer 19 is planarized as shown in FIG. 2B. Planarization can be accomplished using a conventional chemical mechanical polishing (CMP) process, a reactive ion etch process, or the like. In embodiments where a CMP process is used, the CMP process can be a timed polish or the insulative members 17 and 18 can function as polish stops whereupon exposure of the upper surfaces of the insulative members 17 and 18, the CMP system responds by terminating the polishing process immediately, terminating after a predetermined time, or terminating after performing an overpolish processing step. While the cross-sectional view shown in FIG. 2B shows that the planarization process produces surfaces of the sacrificial polysilicon layer 19 and insulative members 17/18 that are co-planar, one of ordinary skill appreciates that the polish or etch back process could alternatively terminate at some point prior to exposing the insulating members 17 and 18. Following planarization, the planarized sacrificial layer now has a more planar topography as compared to the conventional process, thereby facilitating the patterning and etching of the gate-defining members. In addition the resulting etched features will have reduced aspect ratios, as compared to conventionally used process flows, thereby facilitating improved step coverage of subsequently deposited films.

Figure 2C:
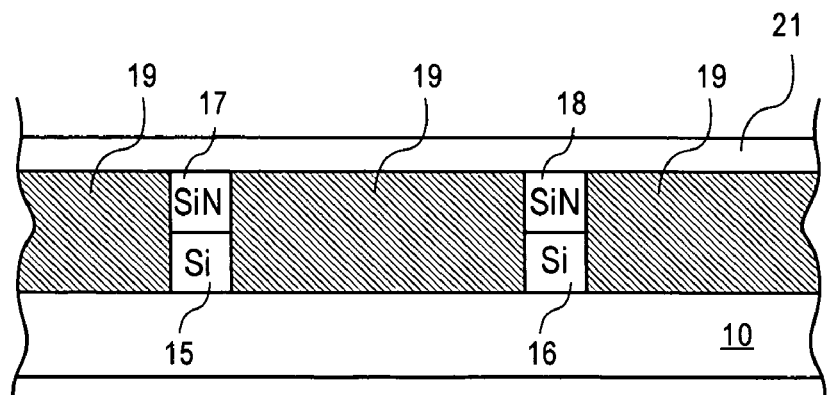
FIG. 2C illustrates the structure of FIG. 2B following deposition of a hardmask layer over the planarized sacrificial layer.

As shown in FIG. 2C, an optional hardmask layer 21 can now be formed over the planarized sacrificial layer 19. In one embodiment, the hardmask layer is a silicon oxynitride layer. Alternatively, the hardmask layer can include other materials such as silicon nitride, silicon-rich-silicon-nitride, or the like. The hardmask layer provides a uniform surface onto which the resist can be patterned, i.e., instead of the exposed surface area including areas of SiN (insulative members 17 and 18) and areas of polysilicon (sacrificial layer 19), the hardmask provides a single surface (e.g., oxide) onto which the resist is patterned. This can reduce resist adhesion problems. In addition, it functions as a protective masking layer during subsequent etch processes to define the gate-defining members and thereby allows the use of thinner resists so that increasingly smaller feature sizes can be patterned. Therefore, the hardmask layer should have a thickness that sufficiently protects the sacrificial layer during the subsequent etch process to define the gate-defining members.

Next, the sacrificial and hardmask layers are patterned and etched. As a result, remaining portions of the sacrificial layer 19 thereby form gate-defining members shown as members 20 and 22 in FIGS. 2D and 2E. The member 20 occupies the region in which the two gates for the I-gate transistor is fabricated as well as areas where contact and/or via connections can be made. The member 22 occupies the region in which the tri-gate is formed for the tri-gate transistor, as well as an area, again for contacts and/or vias. Because the sacrificial layer 19 is now thinner than it otherwise would be using conventional methods and because its topography has much less variation associated with it, the sacrificial layer etch to form the gate-defining members is less prone to problems with underetch and overetch. This not only reduces the occurrence of overetch and underetch related defects, it can also reduce cycle time and improve the overall manufacturability of the sacrificial layer etch process.

Figure 2D:
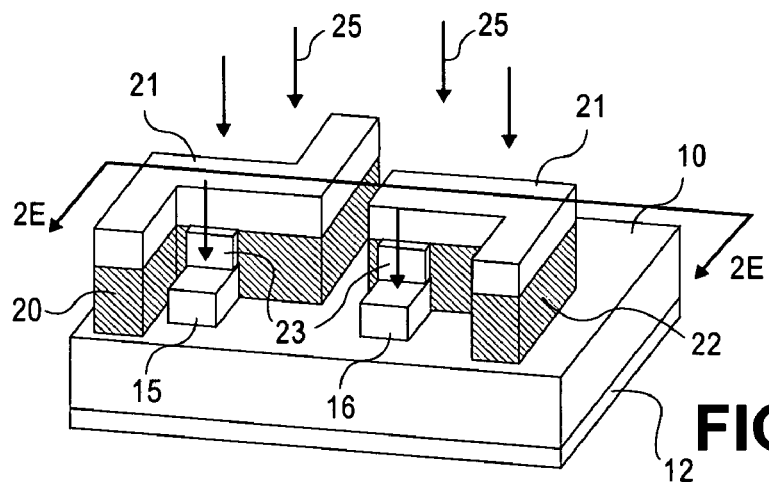
FIG. 2D illustrates a perspective view of the structure of FIG. 1 following the patterning of the hardmask and sacrificial layers.
Figure 2E:
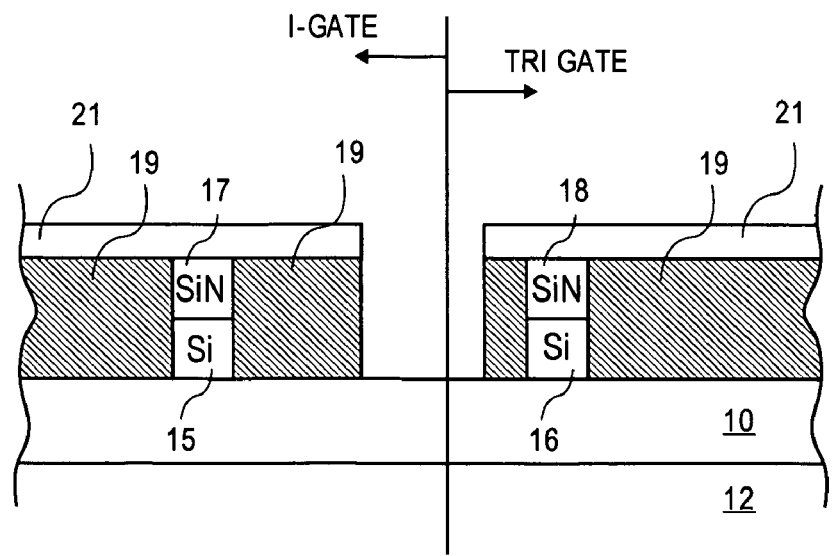
FIG. 2E is a cross-sectional view of the structure of FIG. 2D taken through section line 2E-2E of FIG. 2D.

Also, as shown in FIG. 2D, at this point in the process, portions of the insulative members 17 and 18 not covered by the gate-defining members 20 and 22 may be etched, thereby exposing portions of the underlying silicon bodies 15 and 16. Then, as shown by the arrows 25, the silicon bodies 15 and 16, to the extent they are not covered by the members 20 and 22, can be ion implanted to form source and drain regions for both the I-gate and tri-gate transistors. As is commonly done, but not shown, separate ion implantation steps are used for the p channel and n channel devices, with protective layers or masking layer being used to permit separate implantation of the source and drains for the p channel and n channel devices.

Additionally, spacers 23 may be formed to allow a more lightly doped source and drain region to be implanted adjacent the channel region, and more heavily doped source and drain regions spaced apart from the channel region. This is described in the above-referenced application Ser. No. 10/816,282.

Figure 3:
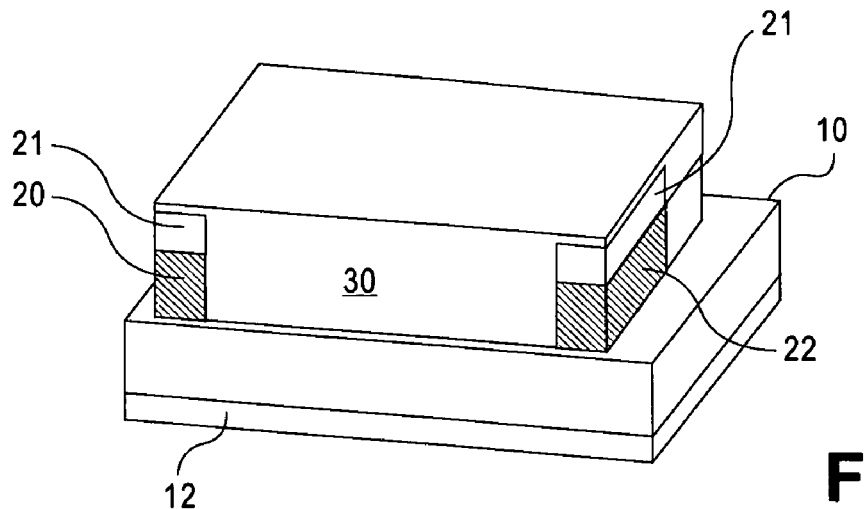
FIG. 3 is a perspective view of the structure of FIG. 2D following the deposition of an interlayer dielectric (ILD).

Turning now to FIG. 3, an ILD 30 is now formed over the insulative layer 10, gate-defining members 20 and 22, and silicon bodies 15 and 16. The ILD 30 is formed adjacent the sides of the members 20 and 22, and as will be seen, is used to form a trench that allows the inlay of metal once the gate-defining members are removed. The ILD 30 may be, for instance, a chemical vapor deposited (CVD) silicon dioxide layer.

The ILD 30 is then planarized, for instance, using a CMP process, so as to remove portions of the ILD 30 and portions of the hardmask 21 overlying insulative members 17 and 18, thereby exposing the upper surfaces of the insulative members 17 and 18. This is illustrated in both FIGS. 4A and 4B. Note, the upper surfaces of members 17 and 18 are flush with the upper surface of the ILD 30 and the upper surfaces of the members 20 and 22.

Figure 4A:
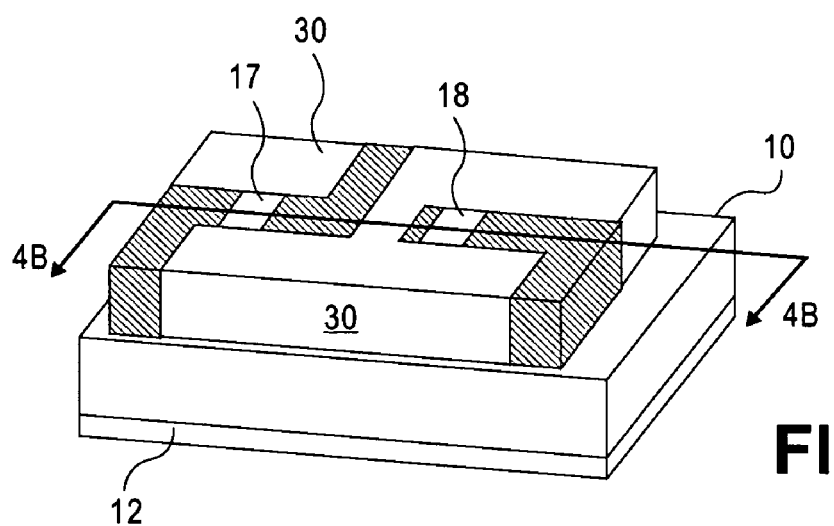
FIG. 4A is a perspective view of the structure of FIG. 3 following planarization of the ILD to a point where it exposes remaining portions of the insulative members 17 and 18.
Figure 4B:
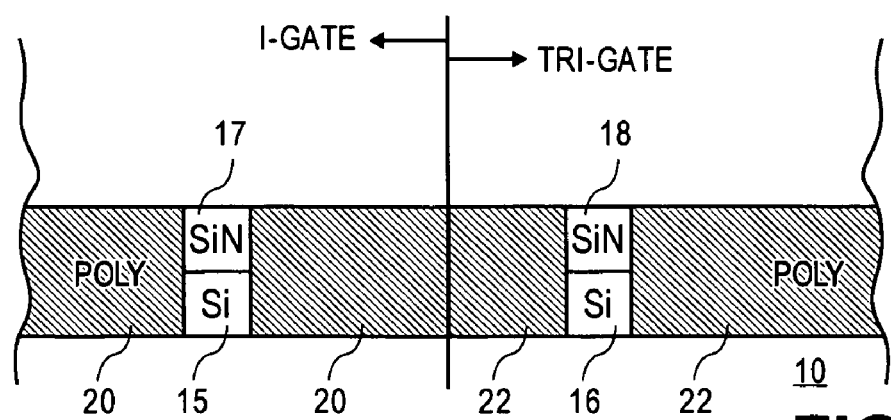
FIG. 4B is a cross-sectional view taken through section line 4B-4B of FIG. 4A.
Figure 5:
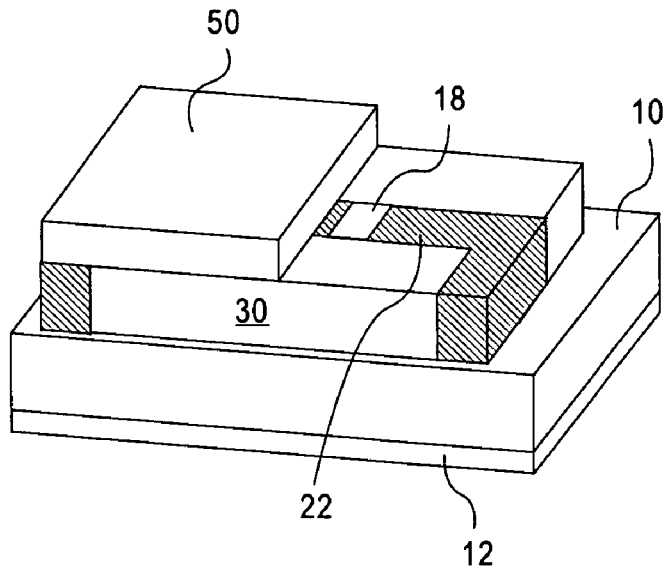
FIG. 5 is a perspective view of the structure of FIG. 4 following the covering of a section of the substrate on which an I-gate transistor is fabricated.

Now, a masking layer (photoresist mask layer and/or an oxide hardmask layer) is deposited over the structure of FIGS. 4A and 4B, and patterned so as to remain in place over the I-gate transistor region. The masking layer 50 covers the insulative member 17. As shown in FIG. 5, the masking layer 50 leaves exposed insulative member 18 of the tri-gate device.

Figure 6A:
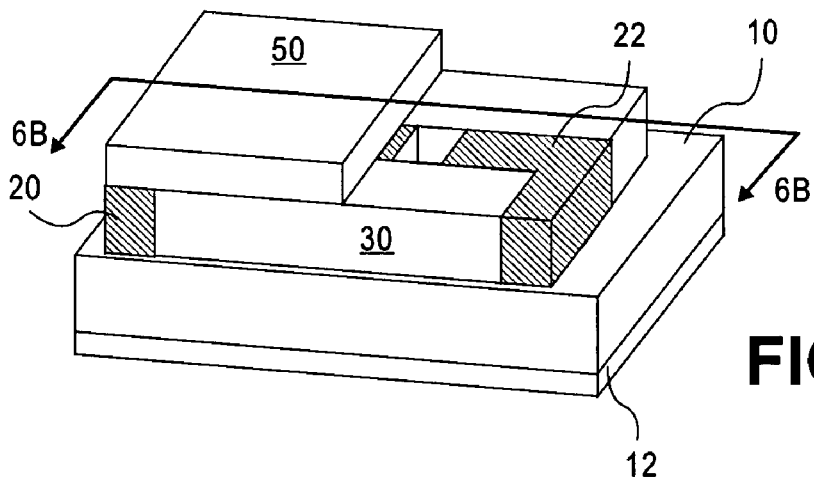
FIG. 6A is a perspective view of the structure of FIG. 5 following an etching step.
Figure 6B:
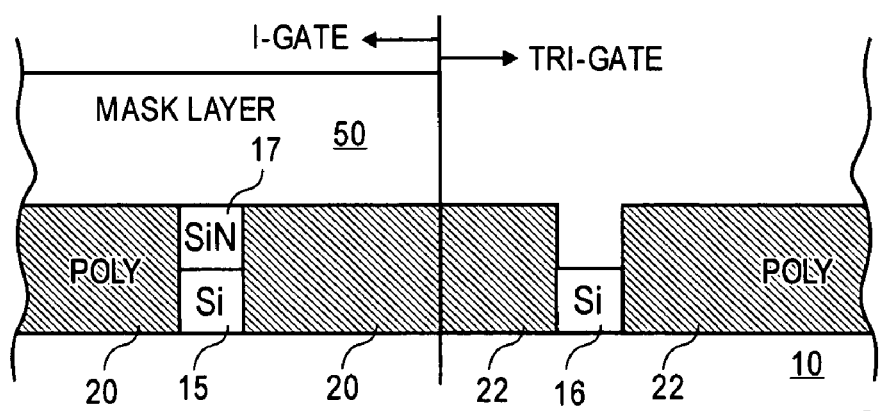
FIG. 6B is a cross-sectional view of the structure of FIG. 6A taken through section line 6B-6B of FIG. 6A.

Then, as shown in FIGS. 6A and 6B, an etching process is used to remove the plug-shaped silicon nitride member 18. An etchant that discriminates between the silicon nitride and both the ILD 30 and sacrificial layer is used so that the ILD 30 and member 22 remain substantially intact. A dry or wet etchant may be used. In one embodiment, a conventional hot phosphoric acid bath is used to remove the silicon nitride member 18. In this embodiment, it may be advantageous to use an oxide hardmask as the masking layer 50. Once the member 18 is removed, the underlying silicon body 16 as shown in FIG. 6B is exposed.

Figure 7A:
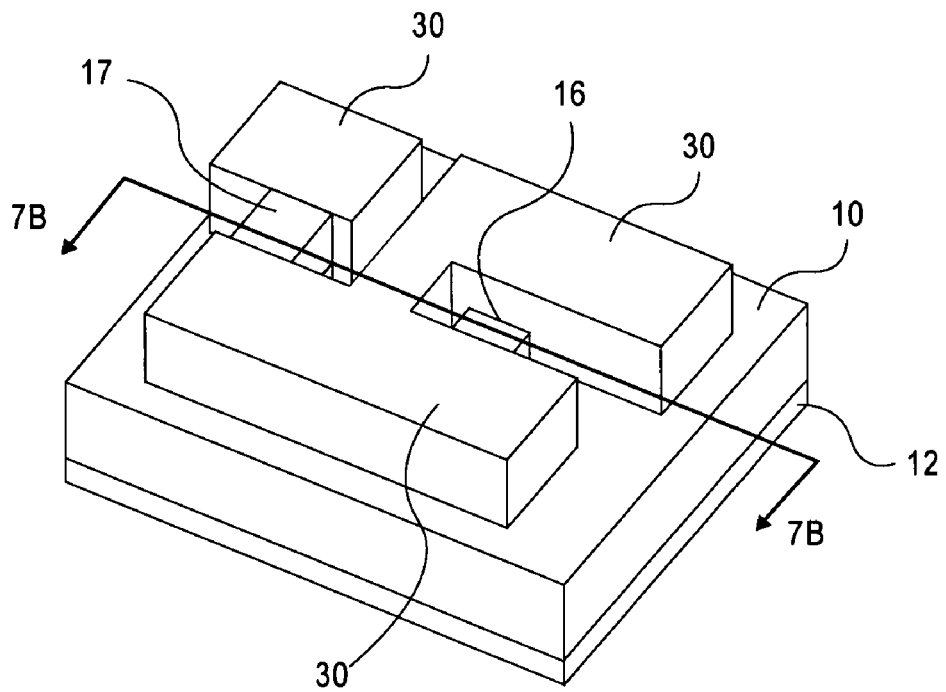
FIG. 7A is a perspective view of the structure of FIG. 6A following removal of the patterned, sacrificial layer and formation of trench opening in the ILD.
Figure 7B:
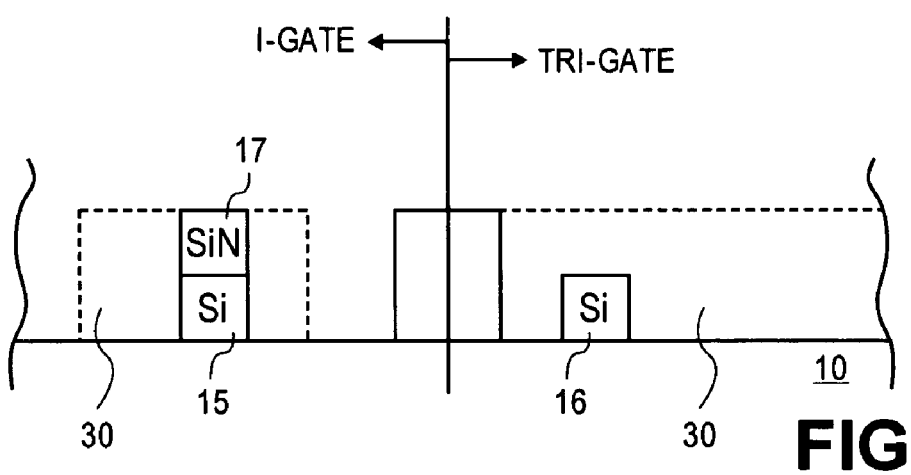
FIG. 7B is a cross-sectional view of the structure of FIG. 7A taken through section line 7B-7B of FIG. 7A.

The polysilicon sacrificial layer is next removed with, for example, a wet etch process. The resultant structure is shown in FIGS. 7A and 7B. The remaining ILD 30 now defines a trench formed in a pattern in which the gates for the transistors are to be fabricated.

Figure 8:
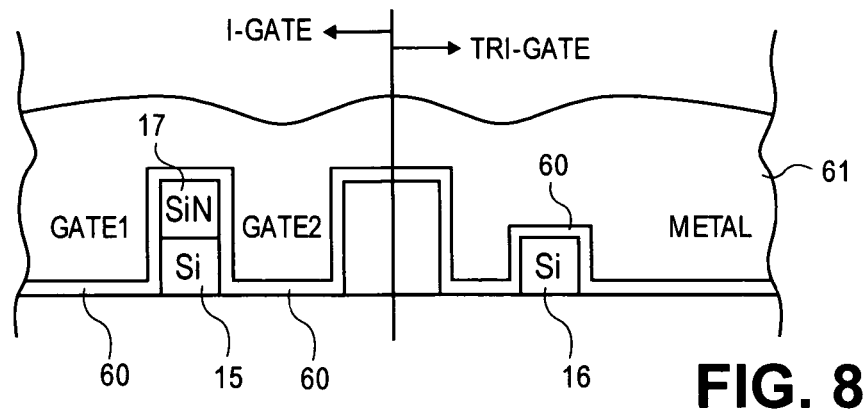
FIG. 8 is a cross-sectional view of the structure of FIG. 7B following the formation of an insulative layer and a gate layer in the trench opening.

A gate dielectric layer 60 is formed on and around each semiconductor bodies 15 and 16 as seen in FIG. 8. Specifically, a gate dielectric may be deposited such that it covers the top surface of the semiconductor body 16 and the insulative member 17 as well as on the opposite side-walls of each of the semiconductor bodies. This gate dielectric ideally has a high dielectric constant, such as a metal oxide dielectric, for instance, $HfO_2$ or ZrO or other high-k dielectrics, such as PZT or BST. A high-k dielectric film can be formed by any well-known technique such as by chemical vapor deposition (CVD), atomic layer deposition (ALD), or the like. Alternatively, the gate dielectric can be a grown dielectric. In one embodiment, the gate dielectric layer 60 is a silicon dioxide film grown with a dry/wet oxidation process. For example, the silicon dioxide film is grown to a thickness of between 5-50 Å. (A conformally deposited dielectric layer is shown in FIG. 8.)

Next, as shown in FIG. 8, a gate electrode (metal) layer 61 is formed over the gate dielectric layer 60. The gate electrode layer 61 may be formed by blanket deposition of a suitable gate electrode material. In one embodiment, a gate electrode material comprises a metal film such as Tungsten, Tantalum, Titanium and/or nitrides and alloys thereof. For the n channel, I-gate and tri-gate transistors, a work function in the range of 4.0 to 4.6 eV may be used. For the p channel, I-gate and tri-gate transistors, a work function of 4.6 to 5.2 eV may be used. Consequently, for substrates with both n channel and p channel transistors, two separate metal deposition processes may need to be used.

Figure 9A:
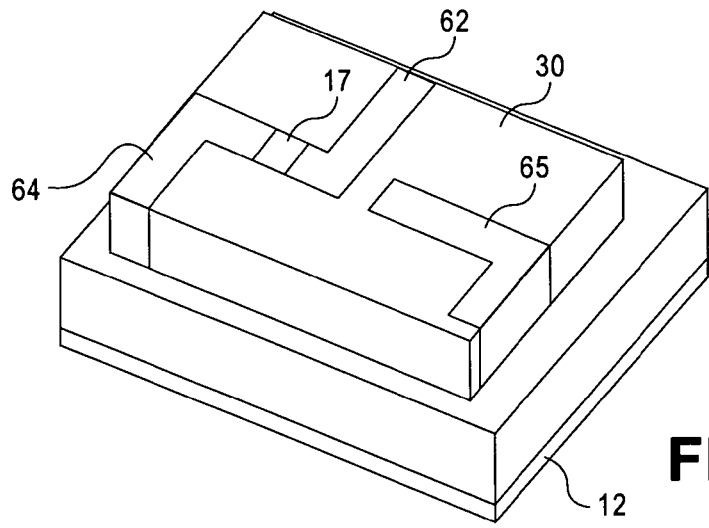
FIG. 9A is a perspective view of the structure of FIG. 8 following planarization of the gate layer.
Figure 9B:
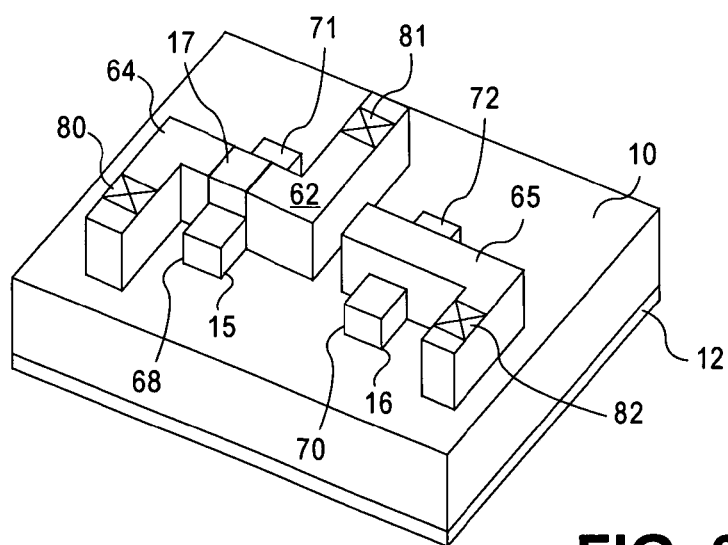
FIG. 9B is a perspective view of the structure of FIG. 9A with the ILD removed.

The metal layer 61 is planarized using, for example CMP, and such planarization continues until at least the upper surface of the insulative member 17 is exposed, as shown in FIGS. 9A and 9B. This is done in order to assure that no metal spans the member 17, since otherwise, the gates in the I-gate transistor will be shorted together. As can be seen in FIG. 9, there are two independent gates 62 and 64 for the I-gate transistor, and a single gate 65 for the tri-gate device.

The gate 65 for the tri-gate transistor has a top surface opposite the bottom surface and has a pair of laterally opposite sidewalls formed adjacent the tri-gate structure best seen in FIG. 9B. These sidewalls are connected on the upper surface of the silicon body. Thus, the gate surrounds the channel region of the tri-gate transistor on three sides. For the I-gate transistor, two independent gates 62 and 64 are separated by the insulative member 17, again best seen in FIG. 9B (where the ILD is shown removed).

Also, best seen in FIG. 9B, the silicon bodies 15 and 16 are shown on the insulative layer 10. Source regions 68 and 70 are shown for each of the transistors along with drain regions 71 and 72. The independent gates 62 and 64 along with their orthogonally disposed contact areas are readily seen. The same is true for the gate 65. These areas allow for easier contact to be made to the gates from overlying conductive structures, as shown by contact regions 80, 81 and 82. While not shown in FIG. 9B, contact can be made to the source and drain regions as well as to the gates from overlying metallization layers through contacts and or vias (not shown).

I-gate transistors may be used in logic circuits along with the tri-gate transistors. I-gate transistors have characteristics which make them desirable in certain circuits. For instance, a single I-gate transistor may provide both a high current and medium current device depending on the potential applied to one or both gates. Such devices may provide a "strong off" device to reduce leakage in a sleep mode or power-down mode. I-gate transistors also provide a device for pre-charge lines by allowing a trickle current. In the above-mentioned patent application, the I-gate devices can be used as DRAM cells, and the process described above, may be used in connection with such DRAM fabrication. In this case, the silicon body 15 is an elongated body formed in a plurality of parallel, spaced-apart lines and used in an array of DRAM cells.

While in the figures two separate silicon bodies are shown, it will be appreciated that a single body may be used. Then, a tri-gate and I-gate transistor may be fabricated in series with one another. In addition, one of ordinary skill appreciates that while in the foregoing discussion silicon is used as the semiconductor material to form the silicon bodies, the bodies can alternatively comprise other semiconductor materials in addition to or instead of silicon. Also, while embodiments of the present invention have been described in conjunction with the formation of transistors using an SOI substrate, one of ordinary skill appreciates that one or more of these embodiments can be incorporated into processes that form I-Gate/Tri-gate transistors in a bulk monocrystalline substrate, For example, dielectric material in trench isolation structures formed in a bulk monocrystalline silicon substrate can be recessed to form raised channel regions (similar to members 15 and 16 in FIG. 2A), and thereafter a sacrificial layer (similar to sacrificial layer 19 in FIG. 2A) can be deposited over the raised channel regions and planarized as shown in FIG. 2B. In this way, topography variations that can impact the patterning and etch processes that define sacrificial gate-defining members can be reduced.

Thus, a process has been described and a resultant structure for an integrated circuit having both an I-gate and tri-gate structure on a common substrate.

What is claimed is:

1. An integrated circuit formed by a process that includes:
   forming at least two semiconductor bodies, wherein the semiconductor bodies have overlying insulative members;
   forming a sacrificial layer over the at least two semiconductor bodies and their overlying insulative members;
   planarizing the sacrificial layer;
   patterning the sacrificial layer to form a gate-defining member and removing portions of the insulative members to form remaining portions of the insulative members on the semiconductor bodies;
   forming a dielectric material adjacent the gate-defining member;
   covering the remaining portion of one of the insulative members;
   removing the remaining portion of another one of the insulative members after covering the remaining portion of one of the insulative members;
   removing the gate-defining member;
   forming an insulative layer and gate electrode layer within a trench defined by removal of the gate-defining member; and
   planarizing the gate electrode layer to form two gate electrodes separated by the remaining portion of one of the insulative members on one of the semiconductor bodies, and to form another gate electrode on another one of the semiconductor bodies.

2. The integrated circuit of claim 1, including planarizing the dielectric material to expose remaining portions of insulative members.

3. The integrated circuit of claim 2, wherein the semiconductor bodies comprise monocrystalline silicon.

4. The integrated circuit of claim 3, wherein the insulative members comprise silicon nitride.

5. The integrated circuit of claim 1, wherein the sacrificial layer comprises polysilicon.

6. The integrated circuit of claim 4, wherein planarizing comprises chemical-mechanical polishing.

7. The integrated circuit of claim 1, including forming a hardmask layer over the sacrificial layer after planarizing.

8. The integrated circuit of claim 7, wherein the hardmask layer includes at least one of a silicon oxynitride layer, a silicon nitride layer, and silicon-rich-silicon-nitride layer.

9. The integrated circuit of claim 1, wherein planarizing is further characterized as using an etch-back process to planarize the surface of the sacrificial layer.

* * * * *